US011863167B1

(12) United States Patent
Qiu

(10) Patent No.: US 11,863,167 B1
(45) Date of Patent: Jan. 2, 2024

(54) DRIVE CIRCUITRY FOR POWER SWITCHING TRANSISTOR OF THE SWITCHING POWER SUPPLY

(71) Applicant: Nanjing Greenchip Semiconductor Co., Ltd., Nanjing (CN)

(72) Inventor: Jianye Qiu, Wuxi (CN)

(73) Assignee: Nanjing Greenchip Semiconductor Co., Ltd., Nanjing (CN)

( * ) Notice: Subject to any disclaimer, the term of this patent is extended or adjusted under 35 U.S.C. 154(b) by 0 days.

(21) Appl. No.: 17/966,882

(22) Filed: Oct. 16, 2022

(30) Foreign Application Priority Data

Aug. 10, 2022 (CN) .......................... 202210957014.7

(51) Int. Cl.
*H03K 17/16* (2006.01)

(52) U.S. Cl.
CPC ..... *H03K 17/167* (2013.01); *H03K 2217/009* (2013.01); *H03K 2217/0081* (2013.01)

(58) Field of Classification Search
CPC ............... H03K 17/164; H03K 17/167; H03K 17/08122; H03K 2217/0081; H03K 2217/009
See application file for complete search history.

(56) References Cited

U.S. PATENT DOCUMENTS

| 6,208,177 B1 * | 3/2001 | Knoedl, Jr. ...... | H03K 19/00361 |
| | | | 327/170 |
| 7,782,135 B2 * | 8/2010 | Berkhout .............. | H03K 17/164 |
| | | | 330/10 |
| 10,790,818 B1 * | 9/2020 | Frank ................... | H03K 17/168 |

* cited by examiner

*Primary Examiner* — Ryan Johnson
*Assistant Examiner* — Colleen J O Toole
(74) *Attorney, Agent, or Firm* — Chih Feng Yeh; Huntington IP Consulting Co., Ltd.

(57) ABSTRACT

A drive circuit for a power switching transistor includes a first pull-up drive transistor connected in parallel with a second pull-up drive transistor, a first pull-down drive transistor coupled to the first and second pull-up drive transistors in series to drive the power switching transistor. When control signal is at a high level, the first pull-up driver is turned on, and the first pull-down driver is turned off. The second pull-up drive transistor being in turn-on or turn-off state is determined by comparing voltage of the power supply with the threshold value. When voltage of the power supply is lower than the threshold value, the first and second pull-up drive transistor are driven together. When voltage of the power supply is higher than the threshold value, the second pull-up driving transistor is turned on only after the driving output is slightly larger than the Miller plateau voltage.

11 Claims, 5 Drawing Sheets

US 11,863,167 B1

DRIVE CIRCUITRY FOR POWER SWITCHING TRANSISTOR OF THE SWITCHING POWER SUPPLY

CROSS-REFERENCE STATEMENT

The present application is based on, and claims priority from, China Application Number 202210957014.7, filed Aug. 10, 2022, the disclosure of which is hereby incorporated by reference herein in its entirety.

BACKGROUND

Technical Field

The present invention relates to technical field of drive circuitry for power switching transistor, and more particularly, relates to a drive circuitry for power switching transistor of the switching power supply.

Related Art

Today's electronic devices, especially consumer electronic products, are required to have advanced functionalities and compact size at the same time, causing the degree of integration and complexity of these electronic devices greatly increased. Due to the continuous development of advanced integrated circuit technology, the implementation of the afore-mentioned highly integrated electronic devices has become possible. However, highly integrated electronic device means that the density of electronic components designed in the chip and on the printed circuit board (PCB) is increased and the spacing between electronic components is also reduced, directly or indirectly causing electromagnetic interference (EMI) issues during the operation of electronic equipment.

While operating the switching power supply circuitry, the EMI issue of the power supply is not only directly related to the PCB layout and transformer structure, but the main power switching transistor has a great influence on the electromagnetic interference (EMI) performance of the power supply. During the operation of the switching power supply, the main power switching transistor is working in the state of ON-OFF fast cyclic switching, its drain-source current is rapidly changing. In the case that the driving ability for the main power switching transistor is too strong (that is, the driving current is too large), the di/dt and dv/dt of the main power switching transistor will be too large, which can lead to a large electromagnetic interference (EMI) during the operation of the switching power supply. However, if the driving ability for the main power switching transistor is too weak (that is, the driving current is too small), which can enlarge the delay of the main power switching transistor to become larger, thereby increasing the switching loss during the operation of the switching power supply.

In order to reduce both electromagnetic interference (EMI) and switching losses, the drive circuitry of the main power switching transistor needs to be further optimized.

Therefore, it is needed to find a compromise between the driving force and the electromagnetic compatibility (EMC) of the drive circuitry for the switching power transistor through a reasonable driving stage circuit layout design, while ensuring the fast switching of the main power switching transistor and improving its efficiency.

SUMMARY

For the aforementioned purpose, a drive circuitry for power transistor of the switching power supply is proposed, which includes a first pull-up drive transistor; a second pull-up drive transistor coupled to the first pull-up drive transistor in parallel; and a first pull-down drive transistor coupled to the first pull-up drive transistor and the second pull-up drive transistor in series, wherein the first pull-up drive transistor is connected to a power supply and gate of an external power switching transistor, and is controlled by an external control signal through a first control path connected to the first pull-up drive transistor; wherein the second pull-up drive transistor is connected to a second control path, the power supply and the gate of the external power switching transistor, and is controlled by the external control signal through the second control path; wherein the first pull-down drive transistor is connected to the external control signal; in a case that the external control signal is at high level, the first pull-up drive transistor is turned on and outputs a predetermined clamp voltage, and the second pull-up drive transistor is turned off; in a case that said external control signal is at high level, on or off state of said second pull-up drive transistor is determined by comparing voltage of said power supply and a threshold voltage, if said voltage of said power supply is higher than said threshold voltage, said second pull-up drive transistor is turned off, and said external power switching transistor is charged by said first pull-up drive transistor; in a case that the external control signal is at high level and voltage of the power supply lower than a threshold voltage, on or off state of the second pull-up drive transistor is determined by comparing output gate voltage of the external power switching transistor, a first reference voltage and a second reference voltage through the second control path; if the output gate voltage of the external power is lower than the first reference voltage, the second pull-up drive transistor is turned off, the external power switching transistor is charged by the first pull-up drive transistor; if the output gate voltage of the external power switching transistor is between the first reference voltage and the second reference voltage, the second pull-up drive transistor is turned on, the external power is charged by the first pull-up drive transistor and the second pull-up drive transistor; if the output gate voltage of the external power switching transistor is higher than the second reference voltage, the second pull-up drive transistor is turned off, the external power switching transistor is charged by the first pull-up drive transistor, wherein the first reference voltage is smaller than the second reference voltage; in a case that the external control signal is at low level, both the first pull-up drive transistor and the second pull-up drive transistor are turned off, the first pull-down drive transistor is turned on, the external power switching transistor is discharged by the first pull-down drive transistor.

In one preferred embodiment, the external control signal is an external PWM control signal.

In one preferred embodiment, the external control signal is branched into two non-overlapping first control signal and second control signal, through an non-overlapping signal generation circuit, to control the first pull-up drive transistor, the second pull-up drive transistor and the first pull-down drive transistor by circuit function selection and control paths.

In one preferred embodiment, the first pull-up drive transistor is a NMOS transistor, the second pull-up drive transistor is a PMOS transistor, the first pull-down drive transistor is a NMOS transistor.

In one preferred embodiment, the drive circuitry for power transistor of the switching power supply further including a voltage divider network connected to the gate of the external power switching transistor and source of the first pull-down drive transistor to act as a sampling circuit for detecting the output gate voltage of the external power switching transistor.

In one preferred embodiment, drain of the first pull-up drive transistor and source of the second pull-up drive transistor are coupled to the power supply; the first pull-down drive transistor is connected in series with the first pull-up drive transistor; wherein drain of the first pull-down drive transistor is coupled to source of the first pull-up drive transistor and drain of the second pull-up drive transistor, source of the first pull-down drive transistor is grounded.

In one preferred embodiment, the first control path includes a switching circuit connected to gate of the first pull-up drive transistor and a voltage limiting circuit coupled thereto, for receiving a first control signal branched from the external control signal, to control on or off state of the first pull-up drive transistor, and to output the predetermined clamp voltage when the first pull-up drive transistor is turned on.

In one preferred embodiment, the second control path includes a first comparison circuit, a second comparison circuit and a two-to-one selection circuit, the two-to-one circuit having a first input terminal, a second input terminal, a selection terminal and an output terminal, the output terminal of the two-to-one selection circuit connected to gate of the second pull-up drive transistor, the second comparison circuit connected to the selection terminal of the two-to-one selection circuit, and the first comparison circuit connected to the second input terminal of the two-to-one selection circuit, the first input terminal of the two-to-one selection circuit connected to the first control signal branched by the external control signal.

In one preferred embodiment, the second comparison circuit inputs and compares the voltage of the power supply with the threshold voltage, and when the external control signal is at a high level and the voltage of the power supply is higher than the threshold voltage, the two-to-one selection circuit selects and outputs the first control signal to turn off the second pull-up drive transistor, the external power switching transistor is charged by the first pull-up drive transistor; when the voltage of the power supply is lower than the threshold voltage, the on or off state of the second pull-up drive transistor is determined by comparing the output gate voltage of the external power switching transistor with the first reference voltage and the second reference voltage through the first comparison circuit; if the output gate voltage of the external power switch transistor is lower than the first reference voltage, a high-level control signal is outputted from the two-to-one selection circuit to turn off the second pull-up drive transistor, the external power switching transistor is charged by the first pull-up drive transistor; if the output gate voltage of the external power switching transistor is between the first reference voltage and the second reference voltage, a low-level control signal is outputted through the two-to-one selection circuit to turn on the second pull-up driver transistor, the external power switching transistor is charged by the first pull-up driver transistor and the second pull-up driver transistor; if the output gate voltage of the external power switching transistor is higher than the second reference voltage, a high-level control signal is outputted from the two-to-one selection circuit to turn off the second pull-up drive transistor, the external power switching transistor is charged by the first pull-up driver transistor, wherein the first reference voltage is less than the second reference voltage; when the external control signal is at low level, both the first pull-up drive transistor and the second pull-up drive transistor are turned off, the first pull-down drive transistor is turned on by the second control signal fed into gate of the first pull-down drive transistor, the external power switching transistor is discharged through the first pull-down drive transistor.

In one preferred embodiment, the two-to-one selection circuit is a multiplexer.

In one preferred embodiment, the second control signal is branched from the external control signal.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1:
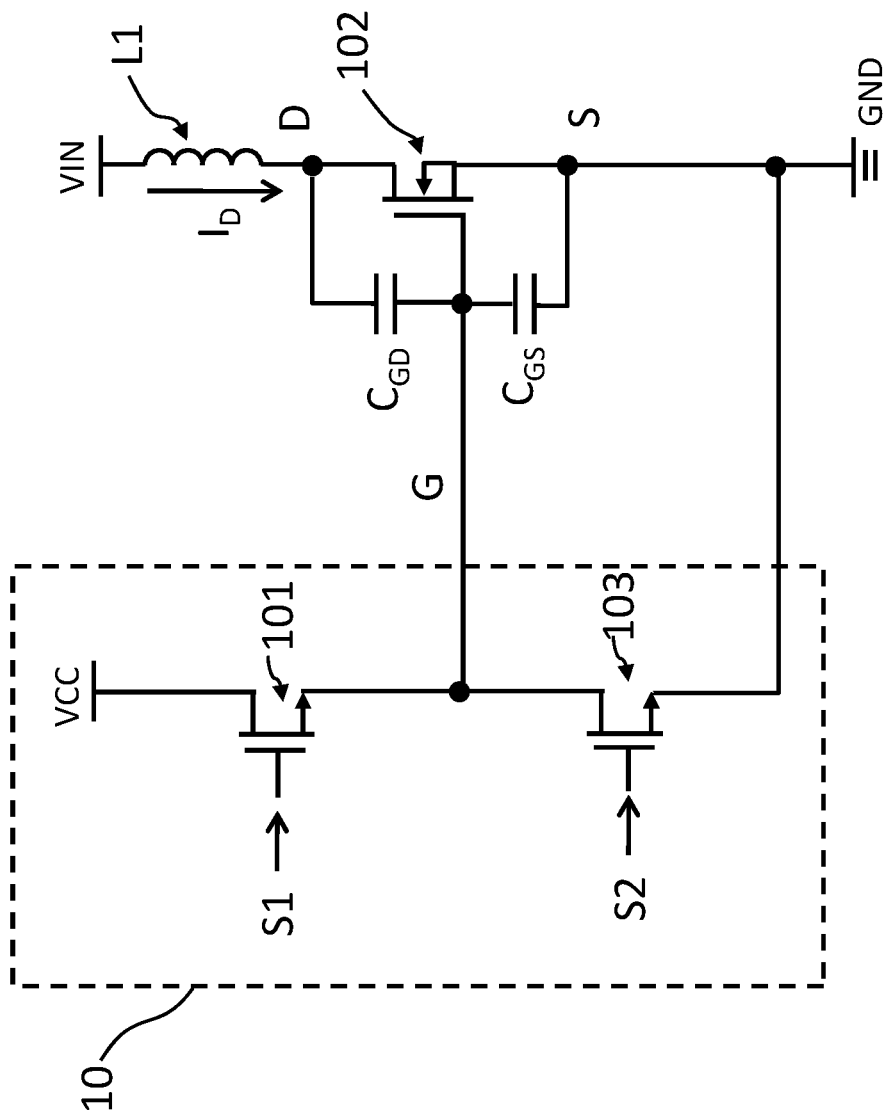
FIG. 1 illustrates a drive circuit for power switching transistor according to a prior art.

Conventionally, as depicted in FIG. 1, an external inductive load L1 connected to the high voltage power supply line VIN is driven by an external main power switching transistor 102 and a suitable drive circuit 10. The drive circuit 10 includes a first transistor 101 and a second transistor 103 both in switch form to act as an upper drive transistor and lower drive transistor respectively, and the drive circuit structure is used to drive the switching action of the main power switching transistor 102. As known to the skilled person in the art, MOSFET devices have been increasingly used in electronic circuits due to their characteristic of easily being driven and to their ability of handling high currents and voltages at high switching frequencies. The main power switching transistor 102 is generally a power MOSFET when process conditions are permitted. Nonetheless, the power dissipation in the main power switching transistor 102 can be reduced by increasing the switching speed, but this increases the generation of electromagnetic interference (EMI).

The main power switching transistor 102, the power MOSFET, whose gate terminal G is driven by the upper and lower drive transistors, which are part of the drive circuit 10, where the upper and lower drive transistors are controlled through the control signals S1 and S2 respectively, the external main power switching transistor 102 has a grounded source terminal S and a drain terminal D connected to the external inductive load L1, the upper drive transistor (first transistor) 101 and the lower drive transistor (second transistor) 103 cannot be turned on or off at the same time. The gate terminal G of the main power switching transistor 102 is driven by the upper drive transistor and the lower drive transistor. At the moment while the upper drive transistor is turned on, the upper drive transistor charges the gate capacitance $C_G$ (including the gate-source capacitance $C_{GS}$ and the gate-drain capacitance $C_{GD}$) of the main power switching transistor 102 with its maximum current capability, so that the main power switching transistor 102 can be rapidly turned on, which will cause the drain-source current of the external main power switching transistor 102 to have a large rising slope during the turn-on process. That means, as voltage and current slopes increase during switching transients, so do EMI levels, therefore, power drive circuit design requires a reasonable compromise between device characteristics, power loss, and EMI. The switching speed of a MOSFET device is strictly related to the amount of the charge being transferred into the dynamic capacitance $C_G$ within the gate terminal, which is equal to the sum of the dynamic capacitances between the gate-source and gate-drain, i.e. $C_G=C_{GS}+C_{GD}$.

The present invention aims to propose a drive circuitry for power switching transistor of the switching power supply, which can provide a compromise between the driving force and the electromagnetic compatibility (EMC) of the drive circuitry for the power switching transistor through a reasonable driving stage circuit layout design, while ensuring the fast switching of the main power switching transistor and improving its efficiency.

In the switching power supply circuit, the EMI performance of the power supply is not only directly related to the PCB layout and transformer structure, but the main power switching transistor has a great influence on the electromagnetic interference (EMI) performance of the power supply as well. In the state of fast cyclic switching of ON-OFF, the drain-source current changes rapidly. If the driving ability of the drive circuit is too strong, the di/dt of the external power switching transistor will be too large, which will lead to poor EMI performance. If the driving ability of the drive circuit is too weak, it is easy to increase the power of the drive transistor and then burn it out. Therefore, a balance or compromise between the driving force and the electromagnetic compatibility (EMC) of the drive circuitry needs to be found when designing the driving circuit. Generally, the upper arm of the driver stage only uses NMOS transistors, so the voltage value of the power supply VCC has a great influence on the driving ability, because the working range of VCC is generally relatively large (8V-28V in this disclosure). When VCC is equal to 8V the driving force is appropriate set, the driving force will be too strong while VCC becomes larger.

In the design of drive circuit proposed in this invention, the upper arm of the driver stage utilizes NMOS and PMOS transistors coupled in parallel. When VCC is lower than a certain voltage (10V in this invention), the driving force of the NMOS transistor is relatively weak, and the NMOS and PMOS transistors are driven together. When VCC is greater than a certain voltage (10V in the present invention), the driving force of the NMOS transistor is strong, so the PMOS transistor is designed to turn on only after the driving output OUT is slightly greater than the Miller plateau voltage. In this way, our design finds a balance/compromise between driving force and EMI.

Figure 2:
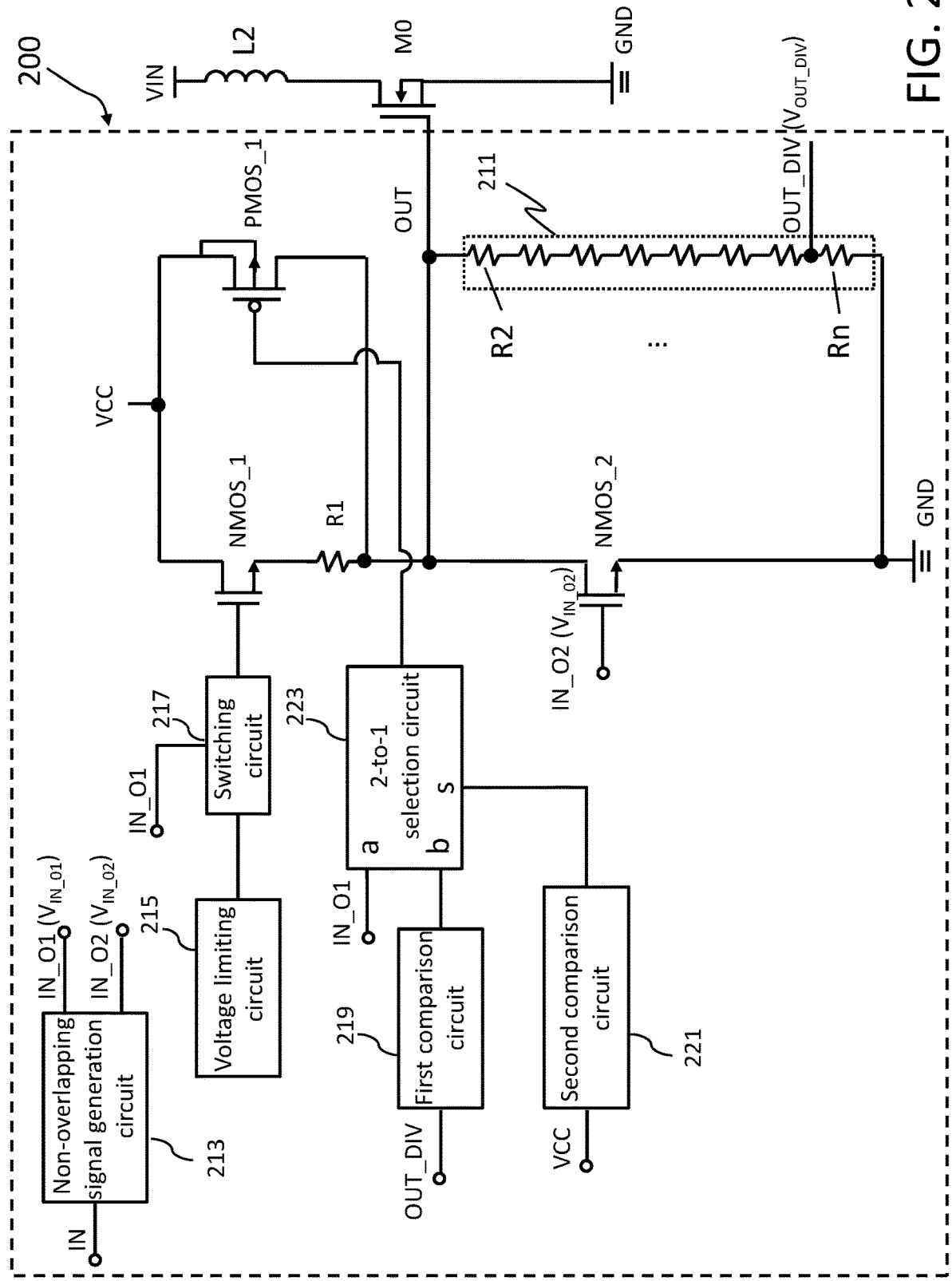
FIG. 2 illustrates a drive circuit for power switching transistor according to a preferred embodiment of the present invention.

Please refer to FIG. 2, which illustrates a schematic drive circuit 200 for a power switching transistor according to the design concept mentioned in the preceding paragraph. According to a preferred embodiment, the external inductive load L1 connected to the high voltage power supply line VIN is driven by the external power switching transistor M0 and the driving circuit 200. The drive circuit 200 at least includes, a first pull-up drive transistor NMOS_1, a second pull-up drive transistor PMOS_1, a first pull-down drive transistor NMOS_2, and a resistor divider network 211, where the first pull-up driver transistor NMOS_1 (which is an NMOS transistor) is connected in parallel with the second pull-up drive transistor PMOS_1 (which is a PMOS transistor), acted as the upper arm of the driver stage, the drain of the first pull-up drive transistor NMOS_1 and the source of the second pull-up drive transistor PMOS_1 is coupled to the power supply VCC. The first pull-down drive transistor NMOS_2 is connected in series with the first pull-up drive transistor NMOS_1 to act as the lower arm of the driver stage, where the drain of the first pull-down drive transistor NMOS_2 (which is an NMOS transistor) is connected to source of the first pull-up drive transistor NMOS_1 and drain of the second pull-up drive transistor PMOS_1, in one embodiment, the first pull-down driver transistor NMOS_2 can be directly or serially coupled to the source of the first pull-up driver transistor NMOS_1 through a resistor R1, and the source of the first pull-down drive transistor NMOS_2 is grounded (GND), where the resistor divider network 211 is a voltage divider circuit composed of a plurality of resistors R2, . . . , Rn connected in series. One end of the voltage divider network 211 is coupled to the source of the first pull-down drive transistor NMOS_2, to the drain of the second pull-up drive transistor PMOS 2 and the other end of the voltage divider network 211 is grounded (GND), and the voltage divider network 211 outputs the sampling voltage $V_{OUT\_DIV}$ at the output terminal OUT_DRV when the drivie circuit 200 is operating.

The external power switching transistor M0 can be, but is not limited to, an NMOS transistor, the gate of which is connected to the source of the first pull-up drive transistor NMOS_1, the drain of the second pull-up drive transistor PMOS_1 and the drain of the first pull-down drive transistor NMOS_2. In one embodiment, the source of the external power switching transistor M0 is grounded, and the external inductive load L2 connected to the high voltage power supply line VIN is driven by the external power switching transistor M0 and the drive circuit 200. The sampling voltage $V_{OUT\_DIV}$ represents gate voltage of the external main power switching transistor M0.

In a preferred embodiment, the drive circuit 200 further includes a non-overlapping signal generation circuit 213 for branching the input PWM control signal into a plurality of branched control signals and sending them to the locations required by the drive circuit as the basis for the timing control during the operation of the drive circuit 200. The two branched control signals generated from the non-overlapping signal generation circuit 213 shown in FIG. 2 are non-overlapping control signals $V_{IN\_01}$ and $V_{IN\_02}$, where both $V_{IN\_01}$ and $V_{IN\_02}$ are PWM control signals output from corresponding output terminals IN_01 and IN_02 of the non-overlapping signal generation circuit 213, which can be utilized to control the ON or OFF of the first pull-up drive transistor NMOS_1, the second pull-up drive transistor PMOS_1, and the first pull-down drive transistor NMOS_2 by different circuit function selections and circuit paths respectively. Technical details will be discussed in the following paragraphs.

In a preferred embodiment, the non-overlapping control signals $V_{IN\_01}$ and $V_{IN\_02}$ can be further adjusted through a level shifter circuit coupled to the respective branched paths, and the voltage level of $V_{IN\_01}$ and $V_{IN\_02}$ will be converted from low voltage to high voltage to meet the required voltage level of subsequent circuit modules. The input PWM control signal is fed from the input terminal IN of the non-overlapping signal generation circuit 213, and the non-overlapping control signals $V_{IN\_01}$ and $V_{IN\_02}$ are respectively output through the first output terminal IN_01 and the second output terminal IN_02 of the non-overlapping signal generation circuit 213.

In a preferred embodiment, the first pull-up driving transistor NMOS_1 is turned on when the control signal is at a high level, and is turned off when the control signal is at a low level.

In a preferred embodiment, the second pull-up driving transistor PMOS_1 is turned on when the control signal is at a low level, and is turned off when the control signal is at a high level.

In a preferred embodiment, the first pull-down driving transistor NMOS_2 is turned on when the control signal is at a low level, and is turned off when the control signal is at a high level, because the control signals $V_{IN\_01}$ and $V_{IN\_02}$ do not overlap.

Figure 3:
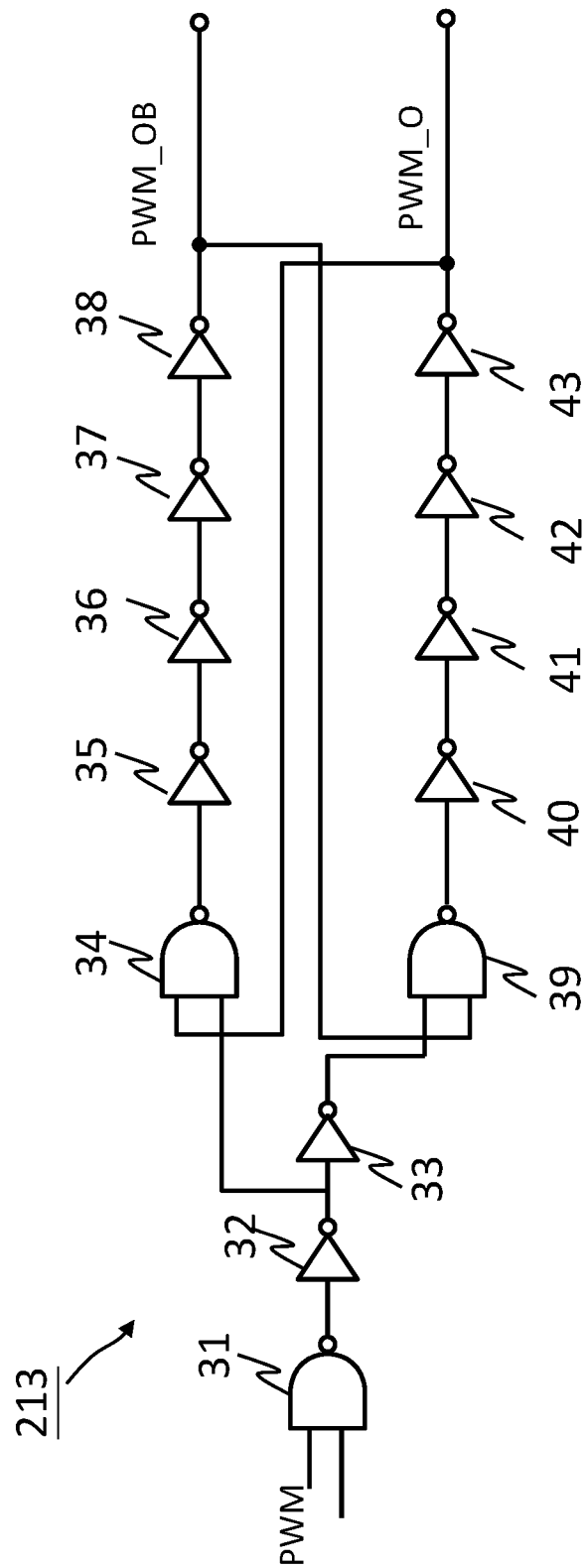
FIG. 3 illustrates an exemplary of a non-overlapping signal generating circuit, according to a preferred embodiment of the present invention.

Referring to FIG. 3, which shows an exemplary circuit diagram of the non-overlapping signal generation circuit 213 but not limited thereto. The non-overlapping signal generation circuit 213 includes NAND gates 31, 34 and 39, and inverters 32, 33, 35, 36, 37, 38, 40, 41, 42 and 43. The first delay line includes NAND gate 34 and inverters 35-38. The second delay line includes NAND gate 39 and inverters 40-43. Control signals PWM OB and PWM 0 are respectively provided at the outputs of inverters 38 and 43 and are fed back to NAND gates 34 and 39. The PWM control signal applied to the input of the non-overlapping signal generation circuit 213 propagates sequentially through one of the delay lines and then through the remaining delay lines.

In order to adjust the voltage levels of the control signals PWM OB and PWM_O, in one embodiment, the control signals PWM OB and PWM 0 can be adjusted by a level shifter circuit (not shown) for regulating the driving range.

Figure 4:
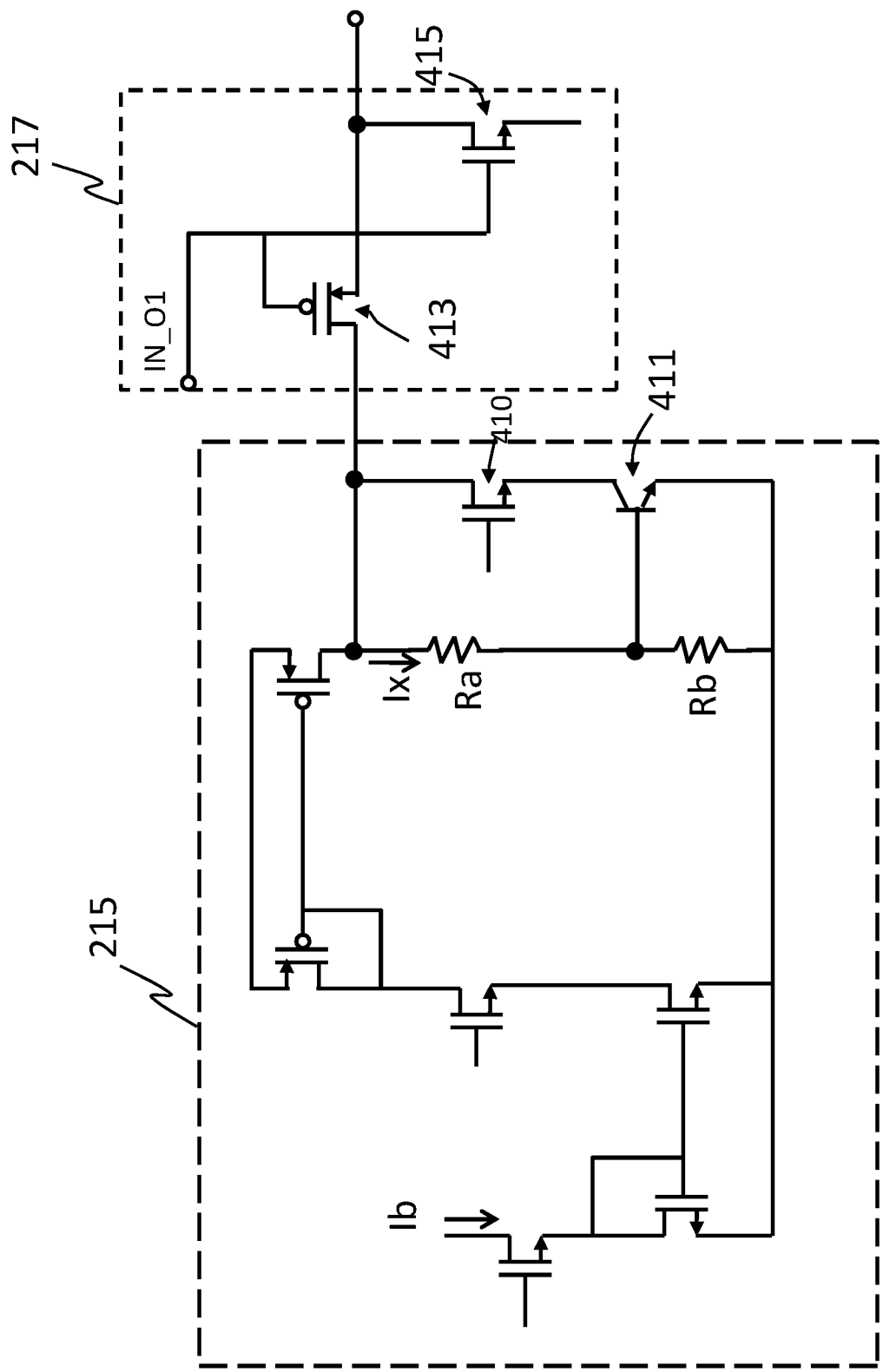
FIG. 4 illustrates a circuit diagram of a voltage limiting circuit and a switching circuit connected thereto, according to a preferred embodiment of the present invention.

For the connection between circuit blocks of voltage limiting circuit 215 and the switching circuit 217 shown in FIG. 2, their corresponding exemplary circuits is depicted in FIG. 4.

As shown in FIG. 4, the voltage limiting circuit 215 shown in FIG. 4 is utilized to input bias current Ib to cascaded N-type and P-type current mirrors, to output from the P-type current mirror with current Ix, and P-type current mirror is connected to a clamp circuit which is appropriately configured the voltage divider with resistors Ra and Rb to connect the NMOS transistor 410 and the NPN transistor 411 at the output end of the P-type current mirror. When the NMOS transistor 410 and the NPN transistor 411 are turned on, the output voltage of the voltage limiting circuit 215 is the highest, That is, the voltage limiting circuit 215 has a clamping function and can be used to limit the output voltage. The switch circuit 217 includes a PMOS transistor 413 and an NMOS transistor 415, where the drain of the PMOS transistor 413 is connected to the output terminal of the P-type current mirror of the voltage limiting circuit 215 and the drain of the NMOS transistor 410 of the voltage limiting circuit 215, and the source of the PMOS transistor 413 is connected to the drain of the NMOS transistor 415, the gate of the PMOS transistor 413 is connected to the gate of the NMOS transistor 415 and the control signal input terminal IN_01. The voltage limiting circuit 215 and the coupled switch circuit 217 are used to provide a first control path for controlling the first pull-up driving transistor NMOS_1 of the driving circuit 200 (refer to FIG. 2).

In a preferred embodiment, the voltage limiting circuit 215 can confine the output clamping voltage based on actual requirements of the designer and the working range of VCC, and its value is a preset voltage value. In a preferred embodiment, the predetermined clamping voltage is 12.5V.

The second pull-up driving transistor PMOS_1 of the drive circuit 200 depicted in FIG. 2 can be controlled by a second control path, which is composed of the first comparison circuit 219, the second comparison circuit 221 and the 2-to-1 selection circuit 223.

The first pull-down driving transistor NMOS_2 of the drive circuit 200 depicted in FIG. 2 can be controlled by the control signal $V_{IN\_02}$ generated by the second output terminal IN_02 of the non-overlapping signal generation circuit 213 which does not overlap with the control signal $V_{IN\_01}$.

Figure 5:
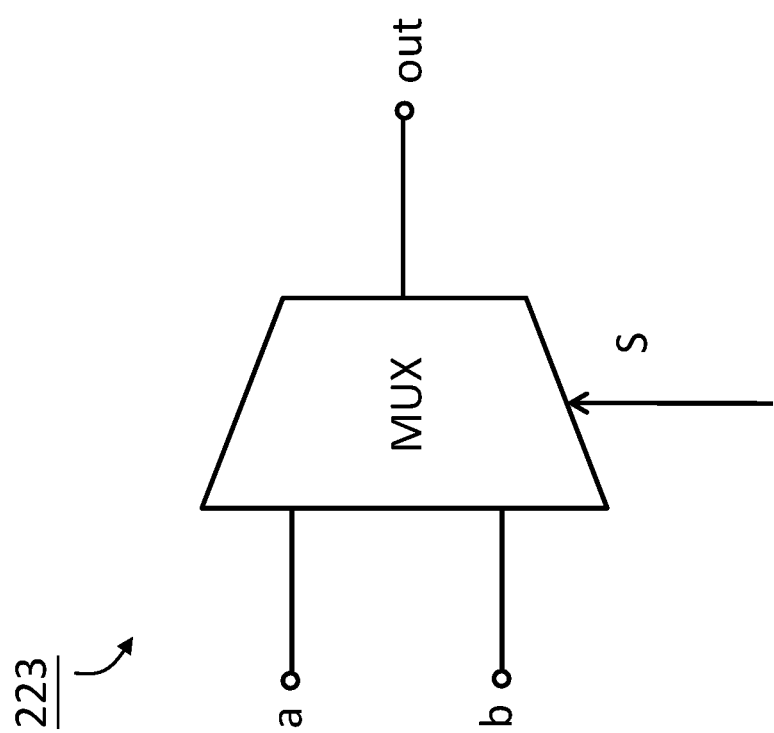
FIG. 5 illustrates an exemplary of a 2 to 1 selection circuit according to a preferred embodiment of the present invention.

Please refer to FIG. 5 for showing a corresponding exemplary circuit of the 2-to-1 selection circuit 223 in FIG. 2. As shown in FIG. 5, the 2-to-1 selection circuit 223, in a preferred embodiment, may be a multiplexer. A multiplexer (MUX) is used to select a signal for output from multiple (here is two) digital or analog input signals. The 2-to-1 selection circuit 223 includes two input terminals a and b, an output terminal and a selection terminal S. Its working principle is that when the selection terminal S inputs is at low level, the output terminal will output the input signal fed from the input terminal a, when the input signal of the selection terminal S is at high level, the output terminal will output the input signal fed from the input terminal b.

In a preferred embodiment, the first comparison circuit 219 shown in FIG. 2 includes more than one comparator, which is connected to the output terminal OUT_DRV of the drive circuit 200 to determine whether the output sampling voltage $V_{OUT\_DIV}$ (corresponding to gate voltage of M0) is greater than Va or less than Vb. There are possible three scenarios of the detected output sampling voltage $V_{OUT\_DIV}$. Firstly, in the case that $V_{OUT\_DIV}$ is greater than Va, the first comparison circuit 219 outputs a high-level control signal; secondly, in the case that $V_{OUT\_DIV}$ is less than Va, the first comparison circuit 219 also outputs a high-level control signal; thirdly, in the case that $V_{OUT\_DIV}$ is between Va and Vb, that is, Vb<$V_{OUT\_DIV}$<Va, the first comparison circuit 219 outputs a low-level control signal.

In a preferred embodiment, the voltage value of Va is 12V, and the voltage value of Vb is 5.5V.

In a preferred embodiment, the second comparison circuit 221 shown in FIG. 2 includes at least one comparator whose input terminal is connected to VCC to determine whether VCC is greater than Vc. When VCC is greater than Vc, the second comparison circuit 221 outputs a low-level signal to the selection terminal S of the 2-to-1 selection circuit 223, and the output terminal of the 2-to-1 selection circuit 223 outputs the input signal fed into the input terminal a, that is, the non-overlapping control signal $V_{IN\_01}$ generated by the IN_01 terminal to control the second pull-up drive transistor PMOS_1; when VCC is less than Vc, the second comparison circuit 221 outputs a high-level signal to the selection terminal S of the 2-to-1 selection circuit 223, and its output terminal outputs the input signal fed into the input terminal b, that is, the control signal generated by the output terminal of the first comparison circuit to control the second pull-up driver transistor PMOS_1.

In a preferred embodiment, the voltage value of the Vc is 10V.

With reference to the above description of the first comparison circuit 219, the second comparison circuit 221 and the 2-to-1 selection circuit 223, specifically, the first pull-up drive transistor NMOS_1 of the drive circuit 200 is controlled by the first control path, which is composed of the switching circuit 217 connected to its gate and the voltage limiting circuit 215 connected to the switch circuit 217, the switching circuit 217 is regulated by a first control signal $V_{IN\_01}$ (output from output terminal IN_01 of the non-overlapping signal generation circuit) to turn on all the time during the Ton period (i.e. when the external PWM control signal is at a high level), enabling that the first pull-up driver NMOS_1 is always turned on (ON) and the clamping voltage is output at 12.5V through the voltage limiting circuit 215, and drain of the first pull-up drive transistor NMOS_1 is connected to the power supply VCC to charge the gate of the external switching power transistor M0. At this time, the first pull-down drive transistor NMOS_2 receives the second control signal $V_{IN\_02}$ (fed from the second output terminal IN_02 of the non-overlapping signal generation circuit 213), since it is at a low level, the first pull-down drive transistor NMOS_2 is turned off; at the same time, the second pull-up drive transistor PMOS_1 of the drive circuit 200 is controlled by a second control path, which is composed of a 2-to-1 selection circuit 223 connected to its gat, a first comparison circuit 219 and a second comparison circuit 221 connected thereto, during the Ton period (i.e. when the external PWM control signal is at a high level) (i) when the VCC voltage is higher than 10V, the second comparison circuit 221 outputs a low level signal to the selection terminal S of the 2-to-1 selection circuit 223, and its output terminal selects the input signal fed from the input terminal a, that is, the non-overlapping control signal $V_{IN\_01}$ generated by the IN_01 terminal is used to control the second pull-up driver transistor PMOS_1, so that the second pull-up driver transistor PMOS_1 is turned off (OFF), the first pull-up driver transistor NMOS_1 connected to the power supply VCC is turned on to charge the gate of the external switching power transistor M0; (ii) when the VCC voltage is lower than 10V, the second comparison circuit 221 outputs a high-level signal to the selection terminal S of the 2-to-1 selection circuit 223, and its output terminal selects the input signal fed from the input terminal b, at this time, the second pull-up driver transistor PMOS_1 is in turned on or off state totally depending on the voltage value of the sampling voltage $V_{OUT\_DIV}$ been inputted into the first comparison circuit 219 (that is, the gate voltage of the external main power switch transistor M0), when $V_{OUT\_DIV}$ is greater than Va, the first comparison circuit 219 outputs a high-level control signal, so that the second pull-up drive transistor PMOS_1 is turned off (OFF); when $V_{OUT\_DIV}$ is less than Va, the first comparison circuit 219 also outputs a high-level control signal, so that the second pull-up driver transistor PMOS_1 is turned off (OFF); when $V_{OUT\_DIV}$ is between Va and Vb, i.e., Vb<$V_{OUT\_DIV}$<Va, the first comparison circuit 219 outputs a low-level control signal, so that the second pull-up drive transistor PMOS_1 is turned on (ON).

When the external PWM control signal is at low level, the first pull-up driver transistor NMOS_1 and the second pull-up driver transistor PMOS_1 are both turned off (OFF), the first pull-down driver transistor NMOS_2 is turned on (ON), and the external power switching transistor M0 is discharged through the first pull-down driving transistor NMOS_2.

That is to say, when VCC is lower than a certain voltage (10V in the present invention), that is, a threshold voltage value, the driving force of the first pull-up drive NMOS_1 is relatively weak, and both the first pull-up drive NMOS_1 and the second pull-up drive transistor PMOS_1 are driven together, which can prevent the external power switching transistor M0 from being burn out due to the power increasing caused by slowly conducting process; when VCC is greater than a certain voltage (10V in this present invention), the driving force of the first pull-up driving transistor NMOS_1 is relatively strong, PMOS_1 is turned off (OFF) while the driving output $V_{OUT\_DIV}$ is less than Vb (5.5V), which can obtain a soft drive effect, and the main power switch transistor M0 is not so quickly turned on during the Miller plateau to improve EMI, after $V_{OUT\_DIV}$ is slightly larger than the Miller plateau voltage, that is, the drive output 5.5V<$V_{OUT\_DIV}$<12V, PMOS_1 is then turned on; when $V_{OUT\_DIV}$ is greater than 12V, PMOS_1 is turned off (OFF). In one embodiment, Vb (5.5V) is the first reference voltage, and Va (12V) is the second reference voltage.

While various embodiments of the present invention have been described above, it should be understood that they have been presented by a way of example and not limitation. Numerous modifications and variations within the scope of the invention are possible. The present invention should only be defined in accordance with the following claims and their equivalents.

What is claimed is:

1. A drive circuitry for power transistor of a switching power supply comprising:
   a first pull-up drive transistor;
   a second pull-up drive transistor coupled to said first pull-up drive transistor in parallel; and
   a first pull-down drive transistor coupled to said first pull-up drive transistor and said second pull-up drive transistor in series, wherein said first pull-up drive transistor is connected to a power supply and gate of an external power switching transistor, and is controlled by an external control signal through a first control path connected to said first pull-up drive transistor;
   wherein said pull-up drive transistor is connected to a second control path, said power supply and said gate of said external power switching transistor, and is controlled by said external control signal through said second control path;
   wherein said first pull-down drive transistor is connected to said external control signal;
   in a case that said external control signal is at high level, said first pull-up drive transistor is turned on and outputs a predetermined clamp voltage, and said second pull-up drive transistor is turned off;
   in a case that said external control signal is at high level, on or off state of said second pull-up drive transistor is determined by comparing voltage of said power supply and a threshold voltage, if said voltage of said power supply is higher than said threshold voltage, said second pull-up drive transistor is turned off, and said external power switching transistor is charged by said first pull-up drive transistor;
   in a case that said external control signal is at high level and voltage of said power supply lower than a threshold voltage, on or off state of said second pull-up drive transistor is determined, by comparing output gate voltage of said external power switching transistor, a first reference voltage and a second reference voltage, through said second control path; if said output gate voltage of said external power is lower than said first reference voltage, said second pull-up drive transistor is turned off, said external power switching transistor is charged by said first pull-up drive transistor; if said output gate voltage of said external power switching transistor is between said first reference voltage and said second reference voltage, said second pull-up drive transistor is turned on, said external power switching transistor is charged by said first pull-up drive transistor and said second pull-up drive transistor; if said output gate voltage of said external power switching transistor is higher than said second reference voltage, said second pull-up drive transistor is turned off, said external power switching transistor is charged by said first pull-up drive transistor, wherein said first reference voltage is smaller than said second reference voltage;

in a case that said external control signal is at low level, both said first pull-up drive transistor and said second pull-up drive transistor are turned off, said first pull-down drive transistor is turned on, said external power switching transistor is discharged by said first pull-down drive transistor.

2. The drive circuitry of claim 1, wherein said external control signal is an external PWM control signal.

3. The drive circuitry of claim 2, wherein said external control signal is branched into two non-overlapping first control signal and second control signal, through an non-overlapping signal generation circuit, to control said first pull-up drive transistor, said second pull-up drive transistor and said first pull-down drive transistor by choosing control paths based on circuit function selection.

4. The drive circuitry of claim 3, wherein said first pull-up drive transistor is a NMOS transistor, said second pull-up drive transistor is a PMOS transistor, said first pull-down drive transistor is a NMOS transistor.

5. The drive circuitry of claim 4, further including a voltage divider network connected to said gate of said external power switching transistor and source of said first pull-down drive transistor to act as a sampling circuit for detecting said output gate voltage of said external power switching transistor.

6. The drive circuitry of claim 4, wherein drain of said first pull-up drive transistor and source of said second pull-up drive transistor are coupled to said power supply; said first pull-down drive transistor is connected in series with said first pull-up drive transistor; wherein drain of said first pull-down drive transistor is coupled to source of said first pull-up drive transistor and drain of said second pull-up drive transistor, source of said first pull-down drive transistor is grounded.

7. The drive circuitry of claim 4, wherein said first control path includes a switching circuit connected to gate of said first pull-up drive transistor and a voltage limiting circuit coupled thereto, for receiving a first control signal branched from said external control signal, to control on or off state of said first pull-up drive transistor, and to output said predetermined clamp voltage when said first pull-up drive transistor is turned on.

8. The drive circuitry of claim 4, wherein said second control path includes a first comparison circuit, a second comparison circuit and a two-to-one selection circuit, said two-to-one circuit having a first input terminal, a second input terminal, a selection terminal and an output terminal, said output terminal of said two-to-one selection circuit connected to gate of said second pull-up drive transistor, said second comparison circuit connected to said selection terminal of said two-to-one selection circuit, and said first comparison circuit connected to said second input terminal of said two-to-one selection circuit, said first input terminal of said two-to-one selection circuit connected to said first control signal branched by said external control signal.

9. The drive circuitry of claim 8, wherein said second comparison circuit inputs and compares said voltage of said power supply with said threshold voltage, when said external control signal is at a high level and said voltage of said power supply is higher than said threshold voltage, said two-to-one selection circuit selects and outputs said first control signal to turn off said second pull-up drive transistor, said external power switching transistor is charged by said first pull-up drive transistor; when said voltage of said power supply is lower than said threshold voltage, said on or off state of said second pull-up drive transistor is determined by comparing said output gate voltage of said external power switching transistor with said first reference voltage and said second reference voltage through said first comparison circuit; if said output gate voltage of said external power switch transistor is lower than said first reference voltage, a high-level control signal is outputted from said the two-to-one selection circuit to turn off said second pull-up drive transistor, said external power switching transistor is charged by said first pull-up drive transistor; if said output gate voltage of said external power switching transistor is between said first reference voltage and said second reference voltage, a low-level control signal is outputted through said two-to-one selection circuit to turn on said second pull-up driver transistor, said external power switching transistor is charged by said first pull-up driver transistor and said second pull-up driver transistor; if said output gate voltage of said external power switching transistor is higher than said second reference voltage, a high-level control signal is outputted from said two-to-one selection circuit to turn off said second pull-up drive transistor, said external power switching transistor is charged by said first pull-up driver transistor, wherein said first reference voltage is less than said second reference voltage;

when said external control signal is at low level, both said first pull-up drive transistor and said second pull-up drive transistor are turned off, said first pull-down drive transistor is turned on by said second control signal fed into gate of said first pull-down drive transistor, said external power switching transistor is discharged through said first pull-down drive transistor.

10. The drive circuitry of claim 8, wherein said two-to-one selection circuit is a multiplexer.

11. The drive circuitry of claim 9, wherein said second control signal is branched from said external control signal.

* * * * *